US010910676B2

(12) United States Patent
Girard et al.

(10) Patent No.: US 10,910,676 B2
(45) Date of Patent: Feb. 2, 2021

(54) NI—CD BATTERY WITH A STATE OF CHARGE INDICATOR

(71) Applicant: SAFT, Bagnolet (FR)

(72) Inventors: Kévin Girard, Blanquefort (FR); Jean-pierre Texier, Saint Aubin de Medoc (FR); Dominique Lacombe, Larressore (FR); Xavier Tridon, Bordeaux (FR); Pascal Lavaur, Saint Dizant du Bois (FR)

(73) Assignee: SAFT, Bagnolet (FR)

( * ) Notice: Subject to any disclaimer, the term of this patent is extended or adjusted under 35 U.S.C. 154(b) by 1024 days.

(21) Appl. No.: 15/351,565

(22) Filed: Nov. 15, 2016

(65) Prior Publication Data

US 2017/0141436 A1 May 18, 2017

(30) Foreign Application Priority Data

Nov. 16, 2015 (FR) .................................... 15 60994

(51) Int. Cl.
*H02J 7/00* (2006.01)
*H01M 10/42* (2006.01)
*H01M 10/48* (2006.01)
*G01R 31/36* (2020.01)
*G01R 31/378* (2019.01)
*G01R 31/392* (2019.01)
(Continued)

(52) U.S. Cl.
CPC ...... *H01M 10/425* (2013.01); *G01R 31/3646* (2019.01); *G01R 31/378* (2019.01);
(Continued)

(58) Field of Classification Search
USPC ......................................................... 320/132
See application file for complete search history.

(56) References Cited

U.S. PATENT DOCUMENTS

2002/0193955 A1* 12/2002 Bertness ............ G01R 31/3648
702/63
2004/0024546 A1* 2/2004 Richter ................. H01M 10/48
702/63

(Continued)

FOREIGN PATENT DOCUMENTS

DE 297 24 016 U1 10/1999
DE 100 56 972 A1 5/2002
(Continued)

OTHER PUBLICATIONS

Office Action of French Patent Application No. 1560994, dated Sep. 5, 2016.

(Continued)

*Primary Examiner* — Samuel Berhanu
(74) *Attorney, Agent, or Firm* — Sughrue Mion, PLLC

(57) ABSTRACT

A battery made up of nickel-cadmium cells includes an indicator for displaying a state of charge comprising sensors for performing continuous measurements of voltage and current and of temperature of the battery, a memory storing at least a history of charge/discharge, a predefined reference voltage, current and temperature, and the measurements and history determined, and a control unit for determining an operation mode of the battery and determining a correction to be applied to the voltage and current measured, calculating a theoretically available capacity of the battery depending on the operating mode and the correction, determining a need for recalibration of the theoretically available capacity of the battery enabling a capacity actually available of the battery to be calculated, and based on the capacity actually available, defining the state of charge of the battery.

12 Claims, 2 Drawing Sheets

(51) Int. Cl.
 *G01R 31/3842* (2019.01)
 *H01M 10/30* (2006.01)
 *G01R 31/374* (2019.01)

(52) U.S. Cl.
 CPC ......... *H01M 10/48* (2013.01); *H01M 10/482* (2013.01); *H01M 10/486* (2013.01); *H01M 10/488* (2013.01); *G01R 31/374* (2019.01); *G01R 31/3842* (2019.01); *G01R 31/392* (2019.01); *H01M 10/30* (2013.01); *H01M 2010/4271* (2013.01)

(56) References Cited

U.S. PATENT DOCUMENTS

| | | | |
|---|---|---|---|
| 2014/0368231 A1* | 12/2014 | Schlueter | G08C 19/02 324/762.02 |
| 2015/0042285 A1 | 2/2015 | Doerndorfer | |
| 2015/0260796 A1 | 9/2015 | Vinit et al. | |
| 2016/0162268 A1* | 6/2016 | Bush | H04L 12/6418 717/178 |

FOREIGN PATENT DOCUMENTS

| | | |
|---|---|---|
| EP | 0 225 106 A1 | 6/1987 |
| EP | 2 317 598 A1 | 5/2011 |
| EP | 2 924 454 A1 | 9/2015 |

OTHER PUBLICATIONS

Communication dated Apr. 4, 2017 from the European Patent Office in counterpart Application No. 16198997.5.

\* cited by examiner

NI—CD BATTERY WITH A STATE OF CHARGE INDICATOR

FIELD OF THE INVENTION

The present invention relates to nickel-cadmium electrochemical storage batteries, commonly known as Ni—Cd batteries. More particularly, the invention relates to a Ni—Cd battery provided with an indicator of its state of charge.

A Ni—Cd battery when operating in a resting or no-load mode, that is to say that the battery is not in a charge mode or in a discharge mode, has a voltage close to 1.2 volts per cell regardless or its state of charge.

It is therefore impossible for a user of a battery of this type who only measures voltage to know what its power capacity actually available is and thus whether it is usable or not.

BACKGROUND ART

In the earlier art, in order to evaluate the electrical capacity theoretically available of a Ni—Cd battery, reference can be made to the teachings of U.S. Pat. No. 4,949,046 which discloses an indicator of the state of charge of such a battery.

In this patent, charge is estimated based on voltage, current and temperature of the battery.

Since battery capacity decreases with time, these measurements are performed every time the battery is fully charged and each time it is completely discharged.

But in fact, this indicator does not take into account variations in voltage, current and temperature of the battery between two measurements and does not propose recalibrating at the end of charge. Thus, this indicator is unable to take account of self-discharge that a battery undergoes when in a resting state in open circuit, nor of its conditions of charge/discharge.

Therefore the degree of charge determined by this indicator is not accurate and does not reveal the actually available capacity of the battery on which the indicator is arranged.

This inaccuracy can be dangerous, especially when it concerns a standby or backup battery, designed to provide a minimum amount of energy necessary to the safety of users.

There is therefore a need to provide an accurate and reliable indicator of the state of charge of a Ni—Cd battery.

SUMMARY OF THE INVENTION

To this end, the present invention provides a battery made up of nickel-cadmium electrochemical storage cells including an indicator of a state of charge, the indicator comprising
  sensors for performing continuous measurements of voltage and current and of temperature of said battery,
  means for determining, at a time t, a history for charge/discharge of said battery based on said measurements,
  data storage means in which there are stored at least a history of charge/discharge, a predefined reference voltage, current and temperature, and the measurements and history determined,
  a control unit for:
    measuring a voltage, a current and a temperature of said battery at a time t,
    determining an operation mode of said battery by comparing the voltage and current measured at time t, with respectively a reference voltage and reference current,
    determining a correction to be applied to the voltage and current measured at time t by comparing the temperature measured at time t, with a reference temperature,
    calculating a theoretically available capacity of said battery depending on the operating mode and the correction, as well as a voltage and a current measured at time t,
    determining a need for recalibration of the theoretically available capacity of the battery by comparing said history determined at time t to a reference history,
    depending on the need for recalibration and the theoretically available capacity, calculating a capacity actually available of said battery,
    based on said capacity actually available, defining the state of charge of said battery,
  a device for displaying said defined state of charge.

Thanks to these provisions, the state of charge indicator of the invention continuously monitors the battery on which it is arranged and thus determines, precisely, the actually available capacity of the battery for display.

According to particular features of this battery, the battery state of charge indicator is adapted for detecting an end of charge of said battery based on the determined history of said battery, determination of the theoretically available capacity of said battery being performed after said end of charge detection.

Thanks to these features, a battery user can determine whether the battery can be used immediately or whether it should be recharged or reconditioned.

It will be recalled that reconditioning of a battery involves a set charge/discharge sequences designed to rebalance the capacities of its positive and negative electrodes, thereby allowing it to recover 100% of its capacity.

According to other particular characteristics of the battery, the reference history and the determined history comprise data relating to:
  an average temperature of the battery, and/or
  a depth of at least one previous discharge of said battery, and/or
  a time the battery has spent in self-discharge in a resting mode in open circuit, and/or
  a number of times the battery has been charged and/or discharged.

Thanks to these provisions, the accuracy of determining the need for recalibration is increased.

According to other particular characteristics of this battery,
  the battery further comprises a water filling circuit,
  the reference history and determined history include data on water consumption.

Thanks to these provisions, the accuracy of determining the need for recalibration and the definition of battery state of charge is improved.

According to a preferred embodiment of this battery, the said battery state of charge indicator is also adapted to
  calculate an absolute state of charge for said battery obtained by dividing the actually available capacity by a predetermined nominal capacity of said battery,
  define a state of charge of said battery as being said absolute state of charge.

Thanks to these features, a battery user can estimate with the naked eye the actually available capacity of the battery and decide whether it is suitable or not for a given future use.

According to another embodiment of this battery, the said battery state of charge indicator is also designed to:

compare a minimum capacity necessary for future use of said battery to the actually available capacity of said battery, said minimum capacity being predefined, define a state of charge of said battery to be
- sufficient if said capacity actually available is strictly greater than said minimum capacity,
- insufficient if said actually available capacity is less than or equal to said minimum capacity.

Thanks to these features, a battery user can quickly find out if the battery can be used or if another battery should be chosen.

In yet another embodiment of this battery, the battery state of charge indicator is also designed to compare a predetermined capacity actually available threshold value for said battery to the capacity actually available of said battery, define a state of charge of said battery as being:
- sufficient if the actually available capacity is strictly greater than said threshold,
- insufficient if the actually available capacity is less than or equal to said threshold.

Thanks to these features, a battery user can quickly find out if the battery can be used or if another battery should be chosen.

In yet another embodiment of this battery, the battery state of charge indicator is also designed to:

determine a depth of discharge and relative degree of discharge of said battery, compare a predetermined relative degree of discharge threshold for said battery to said relative degree of discharge define the state of charge of said battery as being:
- sufficient if the relative degree of discharge is strictly lower than the threshold
- insufficient if the relative degree of discharge is greater than or equal to said threshold.

Thanks to these features, a battery user can quickly find out if the battery can be used or if another battery should be chosen.

According to other particular characteristics of this battery, the display device of the state of charge is:
- either binary if said state of charge is defined as sufficient or insufficient,
- or graduated if said state of charge is defined as absolute state of charge.

The inventors have determined that the above arrangements are optimal.

According to other particular characteristics of this battery,
- a measuring means for current of said battery comprises a shunt,
- a measuring means for temperature of said battery comprises an NTC thermistor.

The inventors have determined that the above arrangements are optimal.

The invention also relates to a management system comprising:
- at least one battery according to the invention,
- a remote control device for state of charge of the at least one battery, the state of charge indicator of the at least one battery being connected via a communication device to the control device.

Thanks to these features, a user of the system can optimize the management of a stock of batteries of the invention.

The invention also relates to a method of indicating a state of charge of a nickel-cadmium electrochemical storage battery according to the invention, the method comprising the steps of

- continuously measuring voltage and current and temperature of the battery,
- determining a charge/discharge history of the battery at a time t based on the measurements,
- measuring a voltage, a current and a temperature of the battery at time t,
- determining an operating mode of the battery by comparing a voltage and a current measured at time t with respect to a reference voltage and a reference current, respectively,
- determining a correction to be applied to voltage and current measured at time t by comparing a temperature $T_T$ measured at time t, when compared to a reference temperature $T_R$,
- calculating a theoretically available capacity of the battery depending on whether the operating mode is charging, discharging or resting R as determined and the said correction,
- determining a need for recalibration RC of the theoretically available capacity of the battery by comparing the history determined at time t with the reference history,
- depending on the need for recalibration and the theoretically available capacity, calculating the actually available capacity of the battery,
- depending on the actually available capacity of the battery, defining a state of charge of the battery,
- displaying the defined state of charge.

The advantages of this method are similar to those of the battery of the invention, are not repeated here.

Other characteristics and advantages of the invention will appear on reading the following description of three preferred embodiments of the invention, given by way of example and with reference to the appended drawings.

In the following description, parts which are identical or perform an identical function bear the same reference sign. For purposes of conciseness of the present description, parts which are identical in the various examples are not described again for each of these examples. In other words, only the differences between the various examples are described in detail, the common elements are described with reference to a single example.

Furthermore, in the following description, the numerical values which are stated, though not limiting, have proved in tests to give the most advantageous results.

DETAILED DESCRIPTION OF PREFERRED EMBODIMENTS

Figure 1:
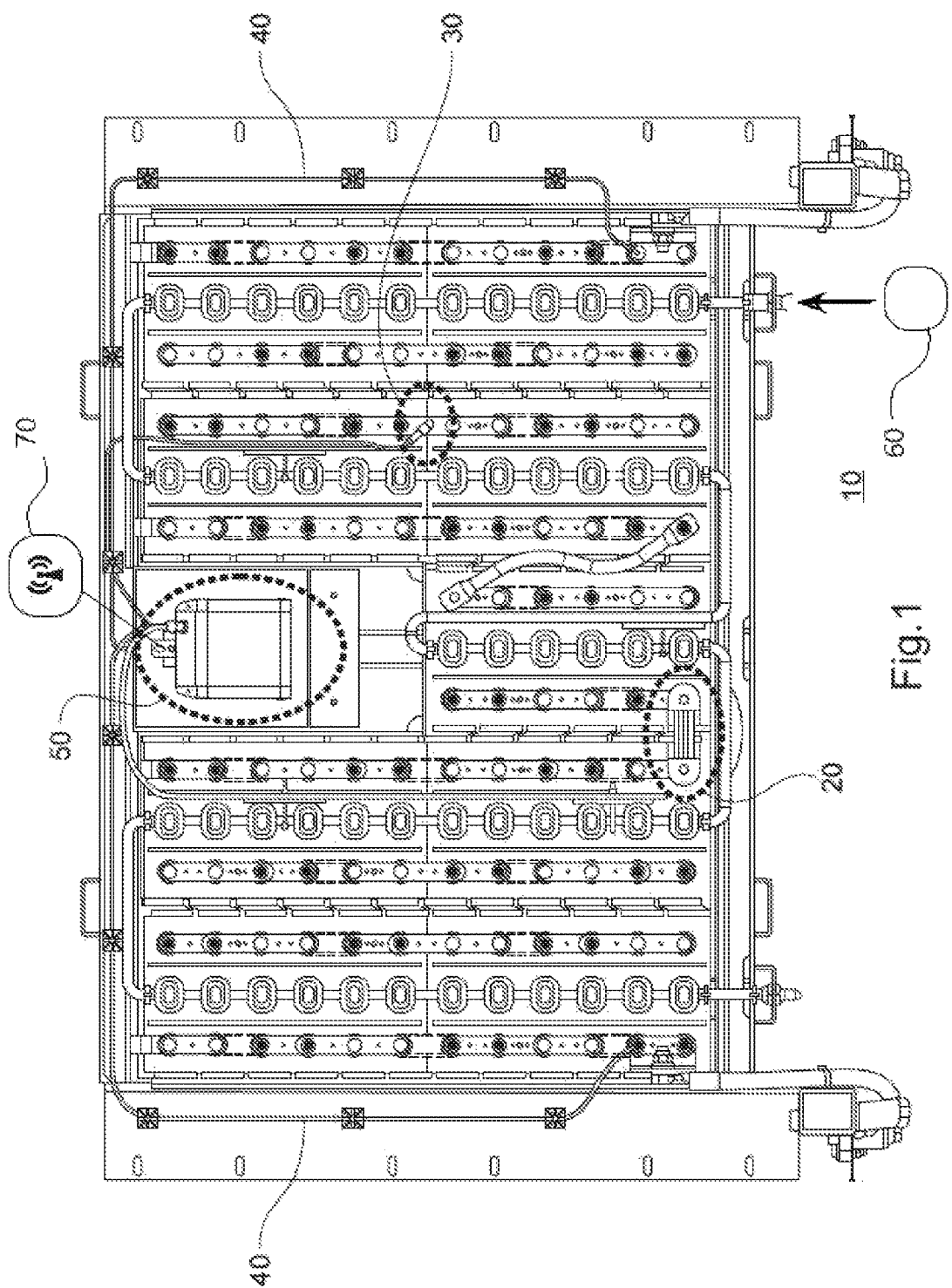
FIG. 1 shows an example of a Ni—Cd battery according to the invention.

FIG. 1 shows an embodiment of a battery 10 according to the invention.

The battery 10 comprises nickel-cadmium, Ni—Cd, electrochemical cells and an indicator of its state of charge.

The invention therefore also relates to the state of charge indicator for a Ni—Cd battery of the invention.

The indicator of the invention comprises:
sensors 20, 30 and 40 to perform voltage and electrical current and temperature measurements of the battery 10,
means for determining, at a time t, a charge/discharge history $H_T$ of the battery 10 based on those measurements,
data storage means,
a control unit,
a device 50 for displaying the state of charge of the battery 10.

In the example, the battery 10 further includes a water filling circuit 60.

In a first example, the storage means and the control unit are represented by a PIC(Peripheral Interface Controller) microcontroller.

In a second example, the data storage means are represented by a removable memory card, such as an SD (Secure Digital) card. Typically, the display device 50 for showing battery 10 state of charge is either binary if the said state of charge is defined as being sufficient or insufficient, or is graduated if the state of charge is defined as an absolute degree of charge.

In the case of a binary display, this may for example be in the form of a red LED which lights up to indicate that the state of charge of the battery 10 is insufficient, and a green LED that lights up to indicate that the state of charge of the battery 10 is sufficient.

Typically, the measuring means 20 for electric current I of the battery 10 include a shunt replacing an inter-cell connection of the battery 10 and the measuring means 30 for temperature of the battery comprise a thermistor, e.g. of the NTC type.

In a preferred example, the shunt used in the invention supports a nominal current of 500 amperes, has a voltage drop of 0.1 volts and a 0.5% resistance tolerance class so that its accuracy is 0.3 milliamps. In the case of a laminated shunt, it is necessary to ensure the orientation and the thickness thereof.

At least a predefined reference history $H_R$ for charge/discharge, a predefined reference voltage, current and temperature, the measurements of voltage and electrical current and temperature and the determined history are stored in the data storage means.

By charge/discharge history, we mean a set of data defined on the basis of continuous measurements of voltage, current and temperature of the battery 10.

Preferably the reference history $H_R$ and the history $H_T$ determined at time t include data relating to an average temperature of the battery 10 and/or the depth of at least one previous discharge of the battery, and/or the time the battery spent in self-discharge in a resting mode of operation R in open-circuit and/or the number of charge/discharge cycles it has performed.

In addition, the reference history $H_R$ and determined history $H_T$ at time t may contain data relating to a ratio of charged capacity to discharged capacity at the last cycle performed and/or during all cycles performed by the battery 10.

In the example, the reference history $H_R$ and the history $H_T$ determined at time t further include values and a threshold for water consumption of the battery 10 determined in particular by temperature measurements.

The control unit is adapted to:
measure a voltage $U_T$, a current $I_T$ and temperature $T_T$ of the battery 10 at time t,
determine a charge operating mode Ch or discharge operating mode D or resting mode R of the battery by comparing a voltage $U_T$ and current $I_T$ measured at a time t, with, respectively, a reference voltage $U_R$ and a reference current $I_R$.
determine a correction to voltage $U_T$ and to current $I_T$ measured at the time t by comparing a temperature $T_T$ measured at time t, when compared to a reference temperature $T_R$,
calculate a theoretically available capacity $CT_{AVAIL}$ of the battery as a function of a charging operating mode, Ch, discharging operating mode, D, or resting operating mode, R, and the said correction,
identify a need for recalibration $R_C$ of a theoretically available capacity $CT_{AVAIL}$ of the battery by comparing a history $H_T$ determined at time t with a reference history $H_R$,
depending on the need for recalibration $R_C$ and the theoretically available capacity, calculate the capacity actually available $CR_{AVAIL}$ of the battery,
based on the actually available capacity $CR_{AVAIL}$, define the state of charge SOC of the battery,
depending on the said need for recalibration and the theoretically available capacity, calculate the actually available capacity of the battery,
depending on this capacity actually available, define a state of charge of the battery.

It will be recalled that the electrical capacity of a battery is defined as the electric charge the battery can provide under specified discharge conditions; it can be expressed in Coulombs, in ampere-seconds or (in practice) in Ampere-hours (Ah 1=3600 s=3600 C).

Concerning the measurement of the temperature $T_T$, the time t can in practice last about an hour. In this case, the temperature $T_T$ value used for the determination of the correction, that is to say, the adjustment to be applied to current, is its average during this last hour. It is important to apply correction values to the electrical capacity values of Ni—Cd cells, especially when these batteries are charging.

Typically, the control unit is of the processor, microcontroller, PLD (programmable logic device), FPGA (field-programmable gate array), EPLD (erasable programmable logic device) CPLD (complex programmable logic device), PAL (programmable array logic) or PLA (programmable logic array) type.

Figure 2:
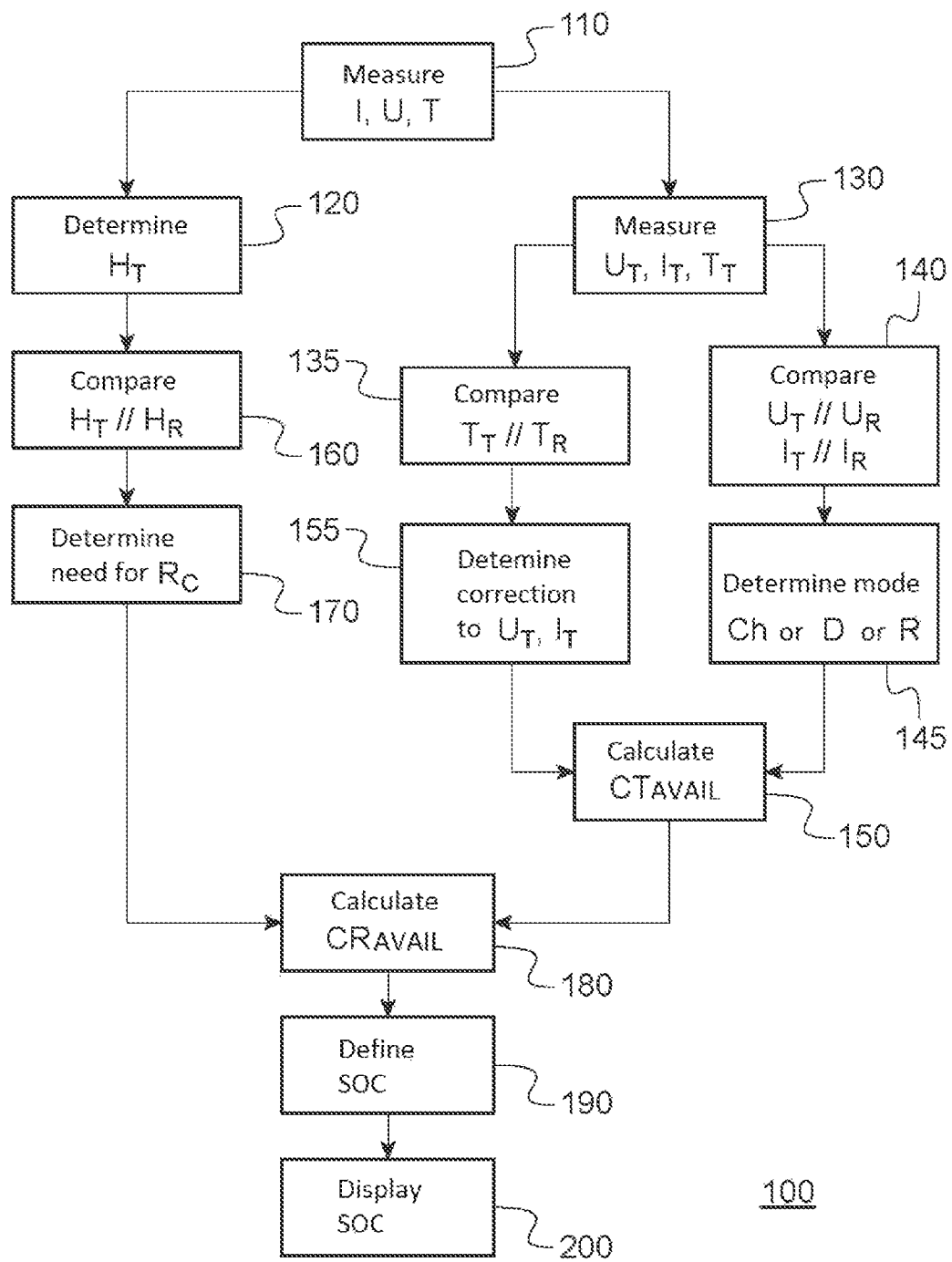
FIG. 2 shows in the form of a flowchart an example of a method for indicating battery state of charge according to the invention.

FIG. 2 shows, in the form of a flowchart, an exemplary method 100 for indicating the state of charge SOC of the battery 10 of the invention.

The method 100 comprises the steps of
continuously measuring, step 110, voltage U and current I and temperature T of the battery 10,
determining, step 120, a charge/discharge history $H_T$ of the battery 10 at a time t based on the measurements,
measuring, step 130, a voltage $U_T$, a current $I_T$ and a temperature $T_T$ of the battery at time t,
determining, step 145, a charging, Ch, discharging, D, or resting, R, mode of the battery by comparing, step 140, a voltage $U_T$ and a current $I_T$ measured at time t, with respect to the reference voltage $U_R$ and the reference current $I_R$, respectively,
determining a correction to be applied to voltage $U_T$ and current $I_T$ measured at time t by comparing a temperature $T_T$ measured at time t, when compared to a reference temperature $T_R$,
calculating, step 150, a theoretically available capacity $CT_{AVAIL}$ of the battery depending on whether the operating mode is charging Ch, discharging D or resting R as determined and the said correction, determining, step 170, a need for recalibration $R_C$ of the theoretically available capacity $CT_{AVAIL}$ of the battery by comparing, step 160, the history $H_T$ determined at time t with a reference history $H_R$, depending on the need for recalibration $R_C$ and the theoretically available capacity, calculating, step 180, the actually available capacity $CR_{AVAIL}$ of the battery 10 depending on the actually available capacity $CR_{AVAIL}$ of the battery, defining, step 190, a state of charge SOC of the battery 10, displaying, 200, the defined state of charge.

Preferably, the method 100 further comprises a step of detecting an end of charging of the battery 10 based on the determined history $H_T$ for the battery.

In practice, the determination of the theoretically available capacity $CT_{AVAIL}$ of the battery 10 is performed after the end of charging has been detected.

Preferably, method 100 further comprises steps of calculating an absolute degree of charge $SOC_{ABS}$ of the battery 10 by dividing the capacity actually available $CR_{AVAIL}$ by a predetermined nominal capacity $C_{NOM}$ of the battery and defining the state of charge SOC of the battery as the degree of charge $SOC_{ABS}$.

In other words, nominal capacity $C_{NOM}$ of the battery 10 is its actually available storage capacity when new.

In a first variant, the method 100 further comprises steps of comparing a minimum capacity $C_{MIN}$ required so that the battery 10 can perform a predetermined mission at the capacity actually available $CR_{AVAIL}$ of the battery, this minimum capacity being predetermined and then defining a state of charge SOC of the battery as being either:

sufficient if the actually available capacity $CR_{AVAIL}$ is strictly greater than the minimum capacity $C_{MIN}$, insufficient if the actually available capacity $CR_{AVAIL}$ is less than or equal to the minimum capacity $C_{MIN}$.

In other words, the minimum capacity $C_{MIN}$ of battery 10 is its capacity to properly perform its predetermined mission.

In a second variant, the method 100 further comprises steps of comparing a predefined threshold $C_{THOLD}$ for capacity actually available of the battery to a capacity actually available $CR_{AVAIL}$ of the battery and defining the state of charge of SOC the battery as sufficient if the actually available capacity $CR_{AVAIL}$ is strictly greater than the threshold $C_{THOLD}$, insufficient if the actually available capacity $CR_{AVAIL}$ is less than or equal to threshold $C_{THOLD}$.

In other words, threshold capacity $C_{THOLD}$ of a battery 10 is the minimum capacity in absolute terms, that is to say without taking account of any further use whatsoever.

In a third variant, the method 100 further comprises the steps of determining a depth of discharge and a relative degree $SOC_{DISCH}$ of discharge of the battery 10, comparing a threshold for relative degree of discharge $SOC_{THOLD}$ of the battery with said relative degree of discharge $SOC_{DISCH}$ and then defining a state of charge SOC of the battery to be:

sufficient if the relative degree of discharge $SOC_{DISCH}$ is strictly less than the threshold $SOC_{THOLD}$, insufficient if the relative degree of discharge $SOC_{DISCH}$ is at or above the threshold $SOC_{THOLD}$.

In order to determine an operating mode of the battery 10, a current $I_T$ of the battery is compared to a predetermined charge current threshold $I_R$, and then if the current $I_T$ exceeds the current threshold $I_R$, it is considered that the battery is operating in a charge mode Ch, if the current $I_T$ is below the current threshold $I_R$, it is compared to a predetermined discharge current threshold.

If current $I_R$ of the battery 10 is less than the discharge current threshold $I_R$, it is considered that the battery is operating in a discharge mode D.

If current $I_T$ of the battery 10 is greater than the discharge current threshold $I_R$, the voltage $U_T$ of the battery is compared to a discharge voltage threshold UR.

If the voltage $U_T$ of battery 10 is below the discharge threshold voltage UR, it is considered that the battery is operating in a resting mode R.

If the voltage $U_T$ of battery 10 is greater than the discharge threshold voltage UR, it is considered that the battery is operating in a charging mode Ch.

The invention also relates to a management system comprising at least one battery, typically a plurality of batteries 10 and a remote state of charge SOC control device for the state of charge of the at least one battery. The indicator for state of charge 30 of the at least one battery 10 is then connected via a communication medium, to the remote control device 70, such as an Internet or intranet server.

Preferably, this communication is by wireless and operates for example by Wi-Fi (Wireless Fidelity), Bluetooth, or a wireless telecommunications network (optionally a low data rate network of the SIGFOX type), etc.

This connection can also be done on any wired network specific to the user, in accordance with the communication protocol for the network.

This communication medium can transfer to the network server, autonomously, regularly and periodically, a set of measured or calculated information regarding the battery, which may include:

a voltage,
a current,
a temperature,
a state of charge,
a water consumption.

The management system may also be able to transfer to the network server at a specific time, an alert to the user upon the detection of a predefined threshold having been reached, for example, a voltage threshold, a current threshold, a state of charge threshold, a consumption of water threshold or an alert upon detecting a need for reconditioning.

Of course, the present invention is not limited to the examples and embodiments described and depicted but is capable of numerous variants accessible to the skilled person.

The invention claimed is:

1. A battery made up of nickel-cadmium electrochemical storage cells including an indicator of a state of charge, the indicator comprising sensors for performing continuous measurements of voltage and current and of temperature of said battery, means for determining at a time t, a history for charge/discharge of said battery based on said measurements, data storage means in which there are stored at least the history of charge/discharge, a predefined reference voltage, current and temperature, and the measurements and history determined, a control unit for measuring a voltage, a current and a temperature of said battery at a time t, determining an operation mode of said battery by comparing the voltage and current measured at a time t, with respectively a reference voltage and reference current, determining a correction to be applied to the voltage and current measured at time t by comparing the temperature measured at time t, with a reference temperature, calculating a theoretically available capacity of said battery depending on the operating mode and the correction, as well as the voltage and the current measured at time t, determining a need for recalibration of the theoretically available capacity of the battery by comparing said history determined at time t to the reference history, depending on the need for recalibration and the theoretically available capacity, calculating a capacity actually available of said battery, based on said capacity actually available, defining the state of charge of said battery, and a device for displaying said defined state of charge.

2. The battery according to claim 1, wherein the said battery state of charge indicator is adapted for detecting an end of charge of said battery based on the determined history of said battery, determination of the theoretically available capacity of said battery being performed after said end of charge detection.

3. The battery according to claim 1, wherein said reference history and said determined history comprise data relating to:
an average temperature of the battery, and/or
a depth of at least one previous discharge of said battery, and/or
a time the battery has spent in self-discharge in a resting mode in open circuit, and/or
a number of times the battery has been charged and/or discharged.

4. The battery according to claim 1, further comprising:
a water filling circuit,
wherein the reference history and the determined history comprise data related to the water consumption of said battery.

5. The battery according to claim 1, wherein the state of charge indicator of said battery is additionally adapted to:
calculate an absolute state of charge for said battery obtained by dividing the actually available capacity by a predetermined nominal capacity of said battery,
define a state of charge of said battery as being said absolute state of charge.

6. The battery according to claim 1, wherein the state of charge indicator of said battery is additionally adapted to:
compare a minimum capacity necessary for future use of said battery to the actually available capacity of said battery, said minimum capacity being predefined,
define a state of charge of said battery to be
sufficient if said capacity actually available is strictly greater than said minimum capacity
insufficient if said actually available capacity is less than or equal to said minimum capacity.

7. The battery according to claim 1, wherein the state of charge indicator of said battery is additionally adapted to
compare a predetermined threshold for capacity actually available of said battery to the capacity actually available of said battery, define a state of charge of said battery as being
sufficient if the actually available capacity is strictly greater than said threshold
insufficient if the actually available capacity is less than or equal to said threshold.

8. The battery according to claim 1, wherein the state of charge indicator of said battery is additionally adapted to
determine a depth of discharge and relative degree of discharge of said battery,
compare a predetermined relative degree of discharge threshold of said battery to said relative degree of discharge
define the state of charge of said battery as being
sufficient if the relative degree of discharge is strictly lower than the threshold
insufficient if the relative degree of discharge is greater than or equal to said threshold.

9. The battery according to claim 1, wherein the display device for state of charge is
either binary if said state of charge is defined as sufficient or insufficient,
or graduated if said state of charge is defined as an absolute state of charge.

10. The battery according to claim 1, wherein
a measuring means for current of said battery comprises a shunt,
a measuring means for temperature of said battery comprises an NTC thermistor.

11. A management system comprising
at least one battery according to claim 1,
a remote control device for state of charge of the at least one battery, the state of charge indicator of the at least one battery being connected via communication means to said control device.

12. A method for indicating a state of charge of a battery made up of nickel-cadmium electrochemical cells according to claim 1, said method comprising the steps of
continuously measuring voltage and current and temperature of the battery,
determining a charge/discharge history of the battery at time t based on the measurements,
measuring a voltage, a current and a temperature of the battery at time t,
determining a charging, discharging, or resting, mode of the battery by comparing the voltage and the current measured at time t, with respect to a reference voltage and a reference current, respectively,
determining a correction to be applied to voltage and current measured at time t by comparing the temperature measured at time t, when compared to a reference temperature,
calculating a theoretically available capacity of the battery depending on whether the operating mode is charging, discharging or resting mode as determined, and the said correction,
determining a need for recalibration of the theoretically available capacity of the battery by comparing the history determined at time t with the reference history,
depending on the need for recalibration and the theoretically available capacity, calculating the actually available capacity of the battery,
depending on the actually available capacity of the battery, defining a state of charge of the battery,
displaying the defined state of charge.

* * * * *